United States Patent
Hubert et al.

(10) Patent No.: US 11,575,362 B2
(45) Date of Patent: Feb. 7, 2023

(54) ELECTROMAGNETIC INTERFERENCE SUPPRESSION COMPONENTS

(71) Applicant: FRIEDRICH-ALEXANDER-UNIVERSITAT ERLANGEN-NURNBERG, Erlangen (DE)

(72) Inventors: Florian Hubert, Hochstadt a. d. Aisch (DE); Thomas Durbaum, Baiersdorf (DE); Stefan Rupitsch, Nuremberg (DE)

(73) Assignee: FRIEDRICH-ALEXANDER-UNIVERSITAT ERLANGEN-NURNBERG, Erlangen (DE)

(*) Notice: Subject to any disclaimer, the term of this patent is extended or adjusted under 35 U.S.C. 154(b) by 122 days.

(21) Appl. No.: 17/253,969

(22) PCT Filed: Jun. 27, 2019

(86) PCT No.: PCT/EP2019/067272
§ 371 (c)(1),
(2) Date: Dec. 18, 2020

(87) PCT Pub. No.: WO2020/007722
PCT Pub. Date: Jan. 9, 2020

(65) Prior Publication Data
US 2021/0265977 A1 Aug. 26, 2021

(30) Foreign Application Priority Data

Jul. 1, 2018 (EP) ..................... 18181056
Jul. 6, 2018 (EP) ..................... 18182255

(51) Int. Cl.
*H03H 9/56* (2006.01)
*H02M 1/44* (2007.01)
*H02M 3/335* (2006.01)

(52) U.S. Cl.
CPC ............. *H03H 9/56* (2013.01); *H02M 1/44* (2013.01); *H02M 3/335* (2013.01)

(58) Field of Classification Search
CPC ........... H02M 1/44; H02M 3/156; H03H 9/56
See application file for complete search history.

(56) References Cited

U.S. PATENT DOCUMENTS 3,593,218 A * 7/1971 Wood ..................... H03H 9/581
310/318
3,694,676 A 9/1972 Vries
(Continued)

FOREIGN PATENT DOCUMENTS

CN 110350776 A * 10/2019 ............. H02M 1/12
CN 209541891 U * 10/2019
(Continued)

OTHER PUBLICATIONS

International Search Report and Written Opinion dated Oct. 2, 2019, issued in PCT Application No. PCT/EP2019/067272, filed Jun. 27, 2019.
(Continued)

*Primary Examiner* — Sisay G Tiku
(74) *Attorney, Agent, or Firm* — Workman Nydegger

(57) ABSTRACT

An EMI suppression component includes a piezoelectric element that is configured to provide a low impedance propagation path for electromagnetic disturbances at a resonance frequency of the piezoelectric element.

20 Claims, 8 Drawing Sheets

(56) References Cited

U.S. PATENT DOCUMENTS

| | | | | | |
|---|---|---|---|---|---|
| 3,697,788 | A | * | 10/1972 | Parker | H03H 9/56 333/191 |
| 4,013,982 | A | * | 3/1977 | Wood | H03H 9/56 333/192 |
| 4,287,493 | A | * | 9/1981 | Masaie | H03H 9/566 333/191 |
| 10,140,566 | B2 | * | 11/2018 | Viikari | G06K 19/0723 |
| 2002/0093387 | A1 | * | 7/2002 | Oita | H03B 1/04 331/74 |
| 2005/0099827 | A1 | | 5/2005 | Sase et al. | |
| 2006/0063489 | A1 | * | 3/2006 | Akaike | H04B 1/30 455/41.2 |
| 2015/0236840 | A1 | * | 8/2015 | Link | H03H 9/706 370/281 |

FOREIGN PATENT DOCUMENTS

| | | | | |
|---|---|---|---|---|
| CN | 210778091 U | * | 6/2020 | |
| CN | 210898935 U | * | 6/2020 | |
| DE | 102006030720 A1 | * | 1/2008 | H01L 41/042 |
| DE | 102012108030 A1 | * | 3/2014 | H03H 9/706 |
| EP | 1 223 668 A2 | | 7/2002 | |
| EP | 1 612 956 A1 | | 1/2006 | |
| WO | WO-2022065595 A1 | * | 3/2022 | G01L 1/183 |

OTHER PUBLICATIONS

Ilan Lewin, *About Using a Crystal as a Notch Filter*, XP055529510, Jun. 2, 2016, https://electronics.stackexchange.com/questions/237765/about-usinq-a-crystal-as-notch-filter (retrieved on Dec. 3, 2018), pp. 1-4.

Murata, *Ceramic Filters (CERAFIL) Application Manual*, Dec. 25, 2015, XP055529344, https://murta.com/~/media/webrenewal/support/library/catalog/products/filter/cerafil/plle.ashx (retrieved Dec. 3, 2018), pp. 1-24.

Sm5bsz.com, *High Performance X-tal filter Using Surplus X-tals*, XP055529362, Jun. 3, 2001, https://sm5bsz.com/pcdsp/pcif.htm (retrieved Dec. 3, 2018), pp. 1-8.

V. Tarateeraseth, *EMI Filter Design: Part III: Selection of Filter Topology for Optimal Performance*, IEEE Electromagnetic Compatibility magazine, IEEE, Piscataway, NJ, vol. 1, No. 2, Apr. 1, 2012, XP01150536, pp. 60-73.

Peipei Meng et al., *Characterizing Noise Source and coupling Path in Flyback Converter for Common-Mode Noise Prediction*, Applied Power Electronics Conference and Exposition, Mar. 6, 2011, XP032014108, pp. 1704-1709.

* cited by examiner

ELECTROMAGNETIC INTERFERENCE SUPPRESSION COMPONENTS

FIELD

The present disclosure relates to electromagnetic interference suppression components. In particular, the present disclosure relates to electromagnetic interference suppression components featuring piezoelectric elements.

BACKGROUND

Electromagnetic interference (EMI) can be caused by electromagnetic disturbances produced by an electric device and may adversely affect the performance of other electric devices. To reduce the emission of electromagnetic disturbances, active or passive EMI suppression components may be used.

SUMMARY

The present disclosure is directed at an EMI suppression component which comprises a piezoelectric element that is configured to provide a low impedance propagation path for electromagnetic disturbances at a resonance frequency of the piezoelectric element.

Notably, the term "EMI suppression component", as used throughout the description and the claims, in particular refers to (passive) electrical components which can be used to suppress the propagation of electromagnetic disturbances, such as, for example, a capacitor. Moreover, the term "electromagnetic disturbances", as used throughout the description and the claims, in particular refers to "any electromagnetic phenomenon which may degrade the performance of a device, equipment or system or adversely affect living or inert matter (IEC, 1989)" [Goedbloed: Electromagnetic Compatibility, P. 4, (1993)]

Furthermore, the term "piezoelectric element", as used throughout the description and the claims, in particular refers to transducers which mechanically deform (due to the inverse piezoelectric effect) upon application of an electrical field. In addition, the term "resonance frequency", as used throughout the description and the claims, in particular refers to an excitation frequency at which the electrical impedance is at a local minimum. E.g., by measuring the electrical current and the electrical voltage while sweeping an electrical excitation frequency range, and calculating the electrical impedance, resonance frequencies may be derived by determining the local minima of the corresponding electrical impedance graph (cf. FIG. 1a).

Providing a low impedance propagation path for electromagnetic disturbances at a resonance frequency of the piezoelectric element allows for a selective attenuation of a peak of the disturbance spectrum. Accordingly, by tailoring the piezoelectric element to (said peak of) the disturbance spectrum, attenuation may be improved compared to (regular) capacitors that would (by themselves) not allow for selectively attenuating said peak. Moreover, many piezoelectric materials exhibit favorable properties regarding insulation and breakdown-voltage which make the EMI suppression component applicable in a wide range of scenarios.

The EMI suppression component may be comprised in a mains filter. For example, the terminals of an EMI suppression component may be (directly) connected (by wire) to poles of a two-wire single-phase, a three-wire single-phase, a three-wire two-phase, a three-wire three-phase, or a four-wire three-phase power distribution network/system.

The EMI suppression component may be comprised in an electric circuit that is configured to be operated at a fixed switching or clock frequency causing electromagnetic disturbances with a spectrum having a peak, wherein the resonance frequency of the piezoelectric element matches the peak frequency.

Hence, the EMI suppression component may suppress the propagation of electromagnetic disturbances over a relatively large frequency band (like a "regular" capacitor) while additionally providing for higher suppression over a relatively small frequency band around the resonance frequency.

The spectrum of the electromagnetic disturbances may have another peak at another resonance frequency of the piezoelectric element.

For instance, the piezoelectric material and the dimensions of the piezoelectric element may be chosen during a design stage such that the piezoelectric element has several resonance frequencies that match peaks of the spectrum of the electromagnetic disturbances. Accordingly, not only one but two (or more) peaks may be suppressed by usage of a single EMI suppression component.

The EMI suppression component may serve as a Y-capacitor.

For example, one terminal of the EMI suppression component may be connected to protective earth and the other terminal of the EMI suppression component may be connected to line, neutral wire, to DC plus or DC minus of a fixed frequency pulse-width or phase-shift controlled converter's intermediate circuit (dc-link), or to any other suitable potential of a converter. At the circuit design stage, the EMI suppression component may replace or supplement one or more Y-capacitors. In this regard, it is noted that the local impedance minimum caused by the resonance of the EMI suppression component may allow for a better peak disturbance attenuation than regular Y-capacitors that have the same capacitance (FIG. 1a). This makes the EMI suppression component particularly useful when serving as a Y-capacitor due to the incumbent limitations regarding the capacitance value resulting from the allowed leakage current.

The EMI suppression component may serve as an X-capacitor.

For example, one terminal of the EMI suppression component may be connected to line and the other terminal of the EMI suppression component may be connected to neutral wire, or one terminal of the EMI suppression component may be connected to DC plus and the other terminal of the EMI suppression component may be connected to DC minus of a fixed frequency pulse-width or phase-shift controlled converter's intermediate circuit (dc-link), or to any other suitable potential of a converter, thereby attenuating differential mode disturbances. Hence, at the circuit design stage, the EMI suppression component may be envisaged to replace or supplement one or more (or even all) X-capacitors within a given circuit design.

The EMI suppression component may be arranged between galvanically isolated primary and secondary sides of a converter. The converter may be a power supply operating at a fixed switching frequency. For example, the converter may be a flyback converter, an active clamp flyback converter, a forward-converter, an active clamp forward-converter, an asymmetric half-bridge, a phase-shifted full-bridge, or a dual-active bridge.

The electric circuit may further comprise another electromagnetic interference suppression component, wherein the other electromagnetic interference suppression component serves as a line filter.

The electric circuit may further comprise a capacitor and/or another EMI suppression component which is/are connected in parallel to said electromagnetic interference suppression component.

By connecting a capacitor and the EMI suppression component in parallel, attenuation may be improved over a relatively large frequency band. By connecting multiple EMI suppression components in parallel, multiple different peaks of the electromagnetic disturbance spectrum may be attenuated or the attenuation of a single peak may be improved.

The electric circuit may further comprise a ceramic oscillator, wherein the ceramic oscillator comprises a piezoelectric resonator. The piezoelectric resonator may be of a same piezoelectric material as the piezoelectric element and/or may have a same temperature-dependency regarding the one or more resonance frequencies as the piezoelectric element (within an operating range of the ceramic oscillator).

Hence, if a temperature change occurs, the oscillator frequency and the resonance frequency may be subject to the same frequency shift, such that both, the oscillator frequency and the resonance frequency remain equal or at least well-aligned. Accordingly, a drift of the resonance frequency may not adversely affect EMI suppression In another example, the piezoelectric element may serve as the piezoelectric resonator of the ceramic oscillator.

For instance, the piezoelectric element may have three or four terminals, wherein a first terminal pair (port) is used in relation to EMI suppression and a second terminal pair (different from the first terminal pair) is used in relation to the ceramic oscillator.

The electric circuit may further comprise an oscillator, wherein the oscillator is operated at the resonance frequency of the piezoelectric element. Even more, the piezoelectric element can be used within the oscillator to directly derive the operation frequency for the electronic device. This derivation may deliver a frequency distinct from the resonance frequency, e.g. half of the resonance frequency, one third of the resonance frequency and so on.

The piezoelectric element may be clamped between walls of a housing of the EMI suppression component or between a wall of the housing of the EMI suppression component and another piezoelectric element.

By clamping (sandwiching) the piezoelectric element, the resonance frequency may be adapted.

The electric circuit may be comprised in a device which further comprises an integrated circuit configured to control the switching or clock frequency of the electric circuit to the effect that the switching or clock frequency or a harmonic of the switching or clock frequency matches a resonance frequency of the piezoelectric element. The integrated circuit may be connected to the piezoelectric resonator.

The electric circuit may be comprised in a device and be, for example, a switching power supply, a digital circuit, a motor, a motor drive, or an electronic circuit (e.g., a power electronic circuit).

Thus, the EMI suppression component may be employed in any electric circuit that operates at a substantially constant frequency producing electromagnetic disturbances with a spectrum having distinct peaks.

The resonance frequency of the piezoelectric element may be tuned to the fixed switching or clock frequency or a harmonic of the fixed switching or clock frequency, wherein the fixed switching or clock frequency or the harmonic of the fixed switching or clock frequency falls under an applicable EMI-regulation.

For example, if only electromagnetic disturbances with frequencies at or above 150 kHz fall under an applicable EMI regulation, the fixed switching or clock frequency may be at or above 150 kHz, wherein the resonance frequency of the piezoelectric element may be tuned to the fixed switching or clock frequency, or the fixed switching or clock frequency may be below 150 kHz, wherein the resonance frequency of the piezoelectric element may be tuned to a harmonic of the fixed switching or clock frequency, wherein the harmonic has a frequency above 150 kHz.

More particularly, electric circuits like switching power supplies, motor drives or other power electronic circuits often operate in frequency bands that allow to beneficially employ the fact that EMI regulations have to be fulfilled starting from a certain frequency (e.g. for a lot of applications, EMI requirements are to be fulfilled starting from 150 kHz). Thus, frequencies slightly lower than 150 kHz, 75 kHz, 50 kHz, etc. are preferred since then, only the second, the third, the fourth harmonics and so on must be suppressed. For these applications, the EMI suppression component could be tuned to those distinct frequencies above 150 kHz that show high disturbance levels.

The starting frequencies for the fulfillment of EMI regulations lead typically to a frequency gap, where possible improvements due to higher frequencies cannot be realized due to the requirement to fulfill said EMI regulations. The proposed EMI suppression component allows operating in these frequency bands, because the EMI can be suppressed sufficiently by tuning the resonance to the (fundamental) operating frequency of the electric circuit.

Manufacturing the EMI suppression component may comprise determining peaks of a spectrum of electromagnetic disturbances produced by an electric circuit and determining a piezoelectric material and dimensions of the piezoelectric element of the EMI suppression component, wherein the piezoelectric element of the EMI suppression component has a resonance frequency that matches a peak frequency of the spectrum.

I.e., the EMI suppression component may be fitted to a given electric circuit at design stage.

Manufacturing the electric device may comprise choosing an EMI suppression component and adapting the operation frequency of an electric circuit of the electric device, such that the adapted electric circuit produces electromagnetic disturbances having a spectrum with a peak wherein the peak frequency matches a resonance frequency of the piezoelectric element of the chosen EMI suppression component.

I.e., the electric circuit may also be fitted to an available EMI suppression component. For instance, EMI suppression components may be available at a variety of given resonance frequencies and an EMI suppression component may be chosen that requires a minimum of adaption effort in view of a given circuit design.

It will be appreciated that the features and attendant advantages of the disclosed EMI suppression component/electric circuit/device may be realized by the disclosed methods and vice versa.

BRIEF DESCRIPTION OF THE DRAWINGS

The foregoing aspects and many of the attendant advantages will become more readily appreciated as the same becomes better understood by reference to the following detailed description, when taken in conjunction with the accompanying drawings, wherein like reference numerals refer to like parts throughout the various views, unless otherwise specified.

Notably, the drawings are not drawn to scale and unless otherwise indicated, they are merely intended to conceptually illustrate the structures and procedures described herein. Moreover, it should be appreciated that the drawings and the following detailed description relate to examples and should not be construed as limiting the inventive concept to any of the shown physical configurations.

DETAILED DESCRIPTION

Figure 1:
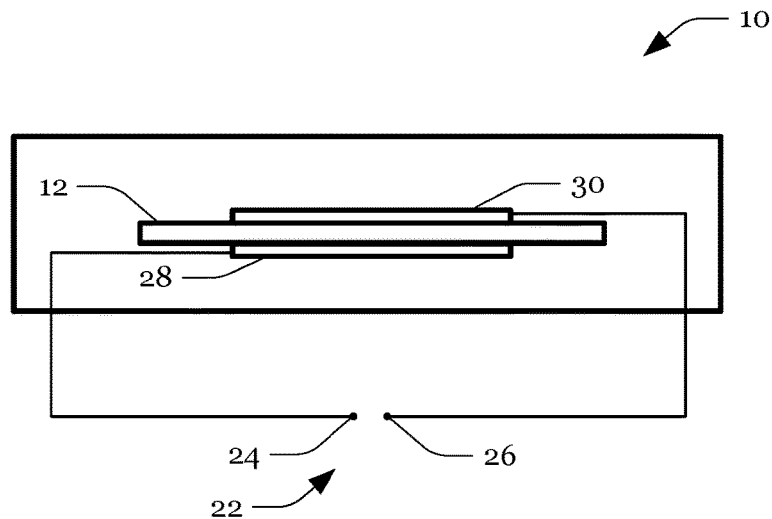
FIG. 1 shows a schematic cross-sectional view of an EMI suppression component, according to an example.

FIG. 1 shows a schematic cross-sectional view of an exemplary EMI suppression component 10. The EMI suppression component 10 comprises a piezoelectric element 12, i.e., a structure made of a piezoelectric material (e.g., lead zirconate titanate, barium titanate, lithium niobite, etc.). The EMI suppression component 10 has a port 22 with a first terminal 24 that is electrically connected to a layer of conductive material 28 (a first electrode) arranged at a first side of the piezoelectric element 12, and a second terminal 26 that is electrically connected to a layer of conductive material 30 (a second electrode) arranged at a second side of the piezoelectric element 12. As shown in FIG. 1, the conductive material layers 28, 30 (electrodes) may (directly) adhere to the piezoelectric element 12 and form a plate capacitor.

When a (non-zero) voltage is applied to the terminals 24, 26, the electromagnetic field generated between the conductive material layers 28, 30 causes mechanical stress in the piezoelectric element 12 due to the inverse piezoelectric effect (to which the piezoelectric material of the piezoelectric element 12 is susceptible). As a result, the piezoelectric element 12 changes its shape. If the electromagnetic field is changed periodically, the piezoelectric element 12 oscillates around its initial position.

Figure 1A:
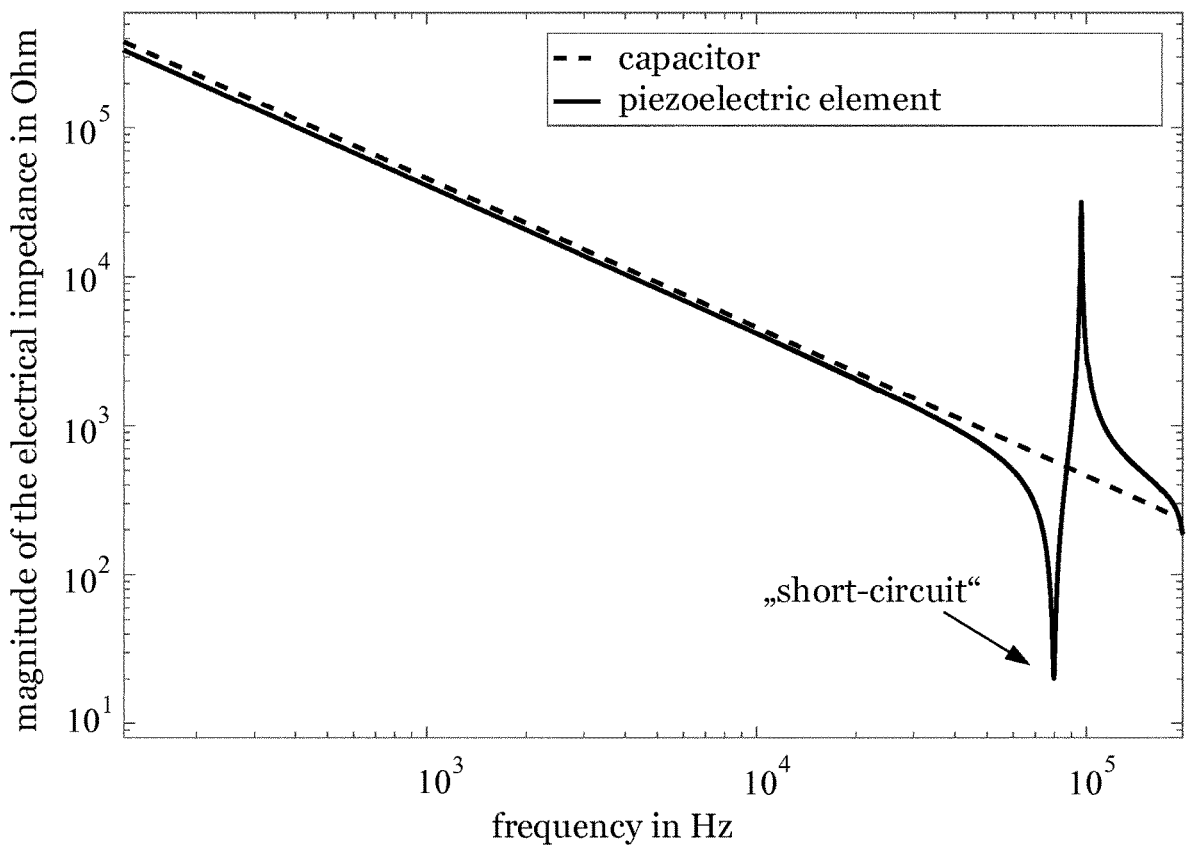
FIG. 1a shows a comparison between the impedance of a (regular) capacitor and an EMI suppression component as exemplified in FIG. 1.

FIG. 1a illustrates the impedance of a (regular) capacitor (i.e., a capacitor with a dielectric material between the electrodes that is not susceptible to the piezoelectric effect) and an EMI suppression component 10 as exemplified in FIG. 1. As can be seen in FIG. 1a, the impedance of the EMI suppression component 10 is at a local minimum if the voltage applied to the terminals 24, 26 alternates at the resonance frequency of the piezoelectric element 12. Accordingly, the EMI suppression component 10 provides a low impedance propagation path ("short circuit") for electromagnetic disturbances at the resonance frequency. At other frequencies, the EMI suppression component 10 behaves like a "regular" capacitor.

Figure 2A:
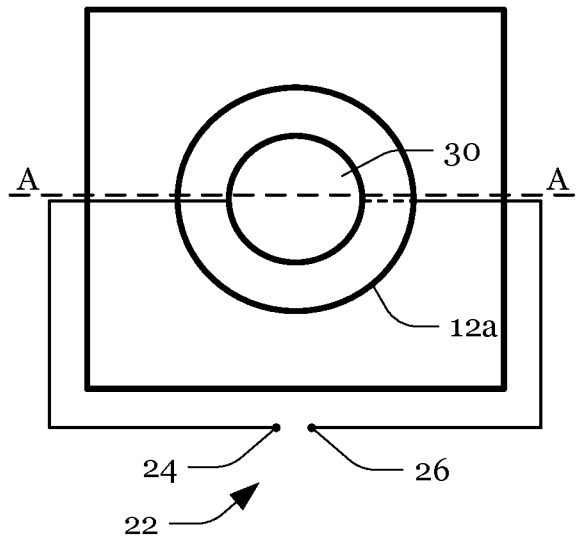
FIG. 2a shows a schematic top view of the EMI suppression component of FIG. 1, according to a first example.
Figure 2B:
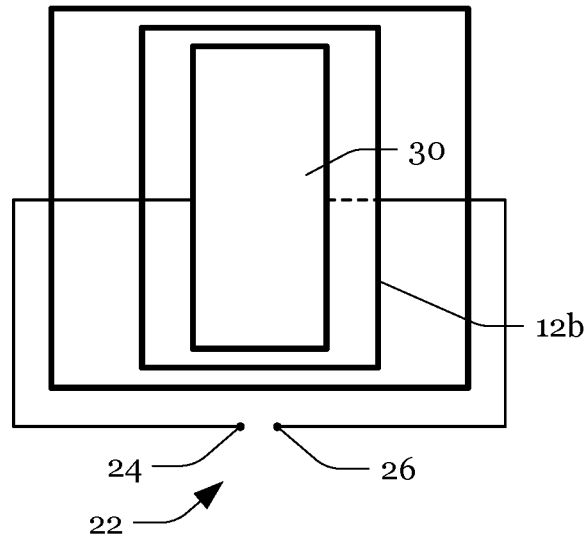
FIG. 2b shows a schematic top view of the EMI suppression component of FIG. 1, according to a second example.
Figure 2C:
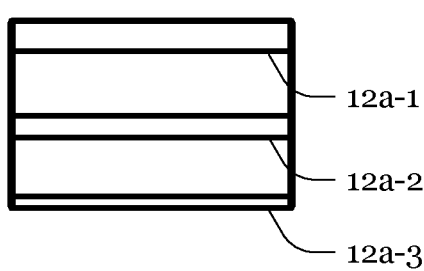
FIG. 2c shows a schematic cross-sectional view of a piezoelectric element, according to a first example.
Figure 2D:
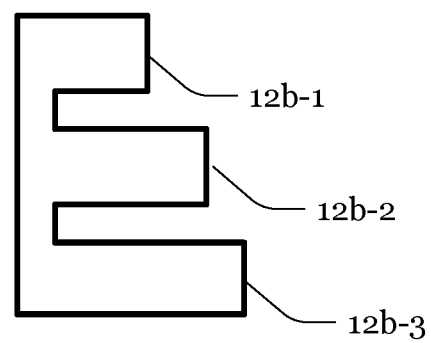
FIG. 2d shows a schematic top view of a piezoelectric element, according to a second example.
Figure 2E:
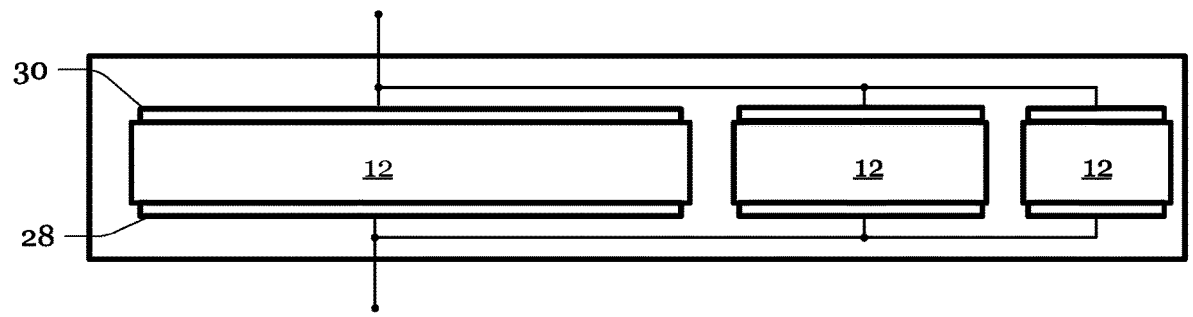
FIG. 2e shows a schematic cross-sectional view of an EMI suppression component, according to another example.
Figure 2F:
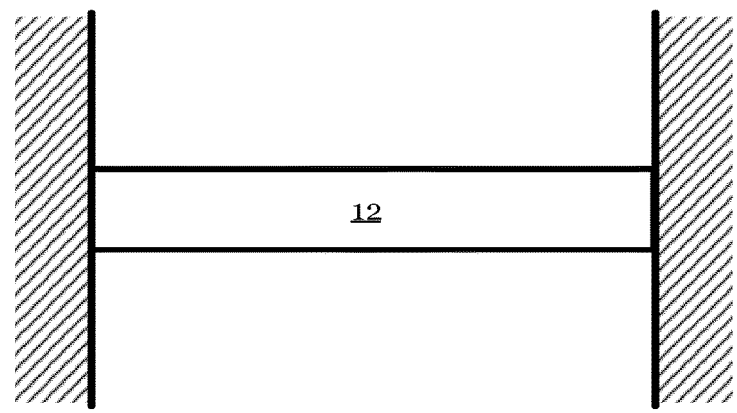
FIG. 2f illustrates a clamped piezoelectric element.

As illustrated in FIG. 2a to FIG. 2d, the piezoelectric element 12 may be provided in various forms. For example, the piezoelectric element 12 may be shaped as a (single) disc (FIG. 2a) or as a single sheet/beam (FIG. 2b). However, the piezoelectric element 12 may also take on more "complex" forms and comprise several discs/sheets/beams (of different dimensions), as illustrated in FIG. 2C and FIG. 2d. Moreover, as shown in FIG. 2e, an EMI suppression component 10 may comprise multiple (separate) piezoelectric elements 12 (of different size/shape), wherein the electrodes 28, 30 (arranged at the sides) of the piezoelectric elements 12 may be connected in parallel. Furthermore, as shown in FIG. 2f, a piezoelectric element 12 may be sandwiched (clamped), for example between walls of a housing of the EMI suppression component 10.

Figure 3A:
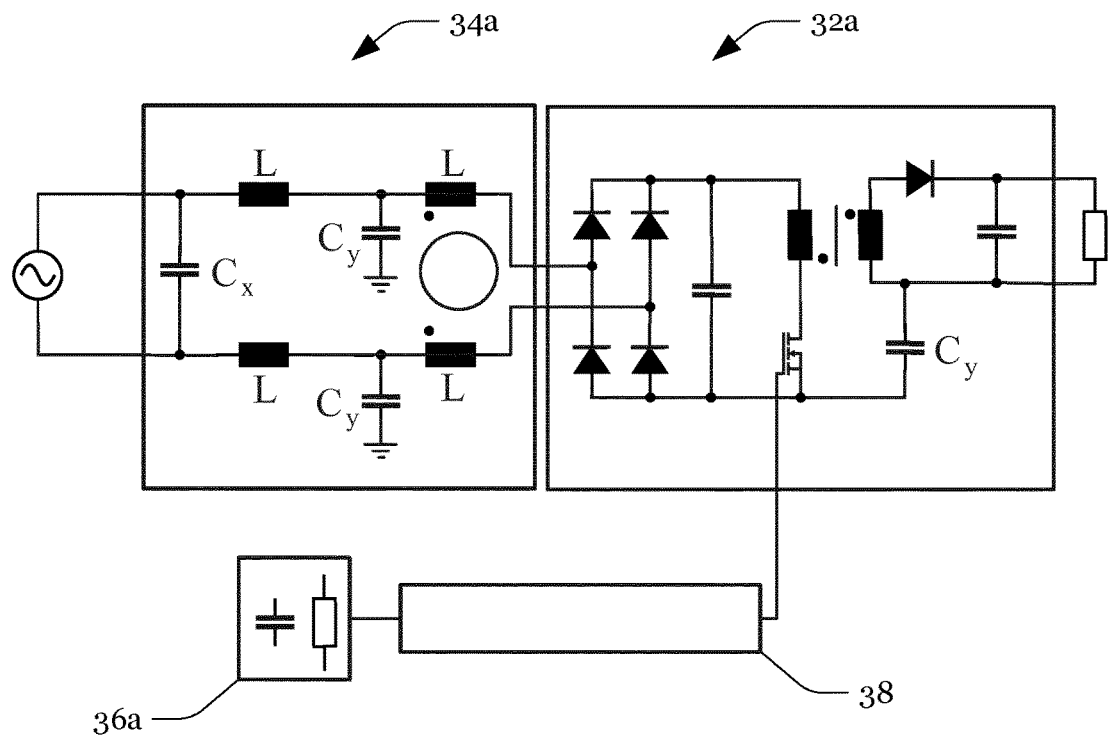
FIG. 3a shows a block diagram of a prior art electric circuit.
Figure 3B:
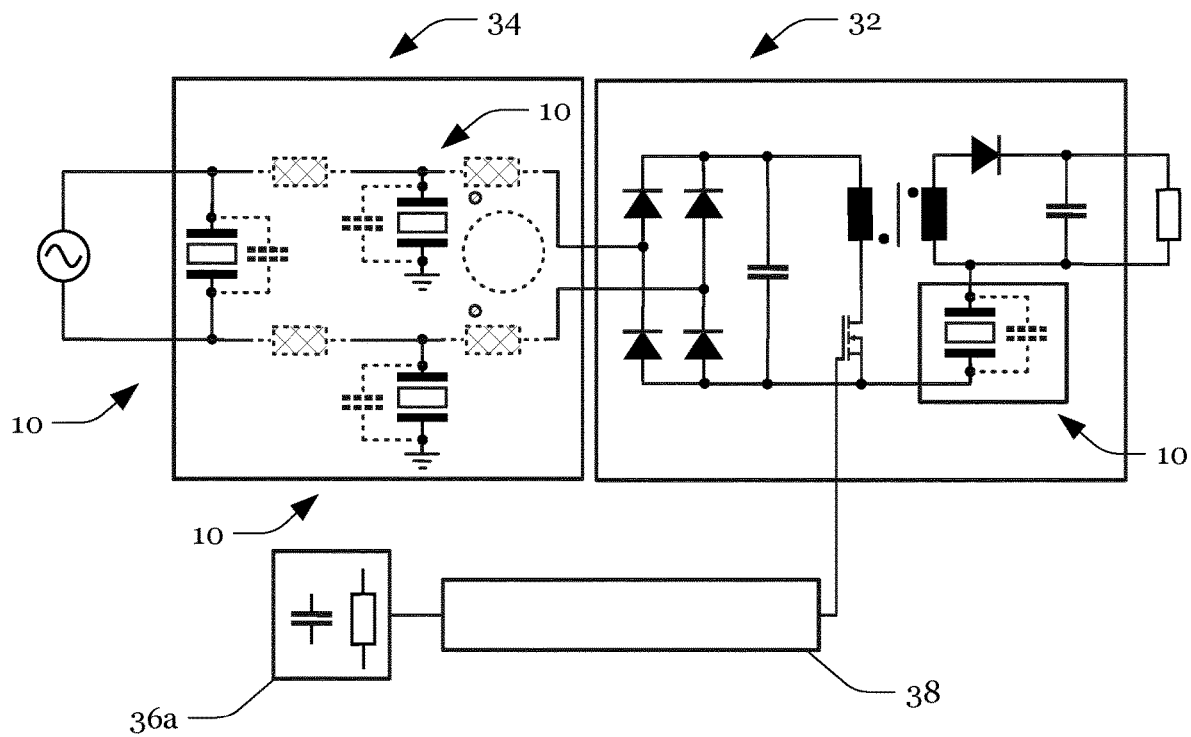
FIG. 3b shows a block diagram of an electric circuit in accordance with the present invention.

FIG. 3a shows a switching power supply 32a (flyback converter) and a mains filter 34a according to the state of the art. The switching power supply 32a is controlled via a control circuit 38 that is connected to an oscillator 36a (RC circuit). As shown in FIG. 3b, any (regular) capacitor (that adds to filtering electromagnetic disturbances) within the mains filter 34a may be replaced or supplemented by an EMI suppression component 10. I.e., the mains filter 34 may comprise one or more EMI suppression components 10 that serve as X-capacitors and one or more EMI suppression components 10 that serve as Y-capacitors. Accordingly, common mode and differential mode disturbances can be filtered when employing EMI suppression components 10. Instead of being replaced, the dashed components might still be used, however, due to the employment of the EMI suppression component 10, the capacitance, the inductance, the number, the size and/or the cost of said components may be reduced.

Moreover, both (galvanically separated) sides of a fixed frequency converter e.g. a flyback converter, a forward-converter, an asymmetric half-bridge, a phase-shifted full-bridge, a dual-active bridge, and so on, may be connected to an EMI suppression component 10 (serving as a Y-capacitor) due to the favorable properties of available piezoelectric materials regarding insulation and breakdown-voltage. Furthermore, the EMI suppression component 10 may be used instead of or in parallel to any (regular) capacitor in an electronic device that is used to reduce EMI by providing a "high-frequency short circuit".

Figure 3C:
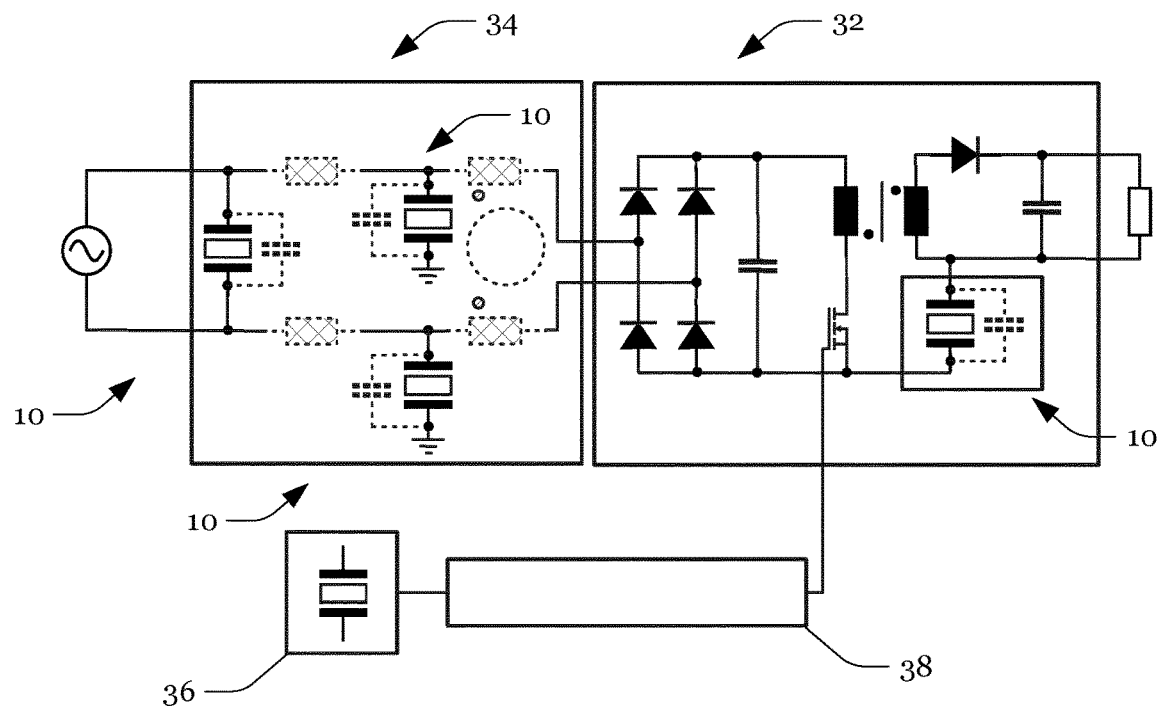
FIG. 3c illustrates a modification of the electric circuit of FIG. 3b.
Figure 3D:
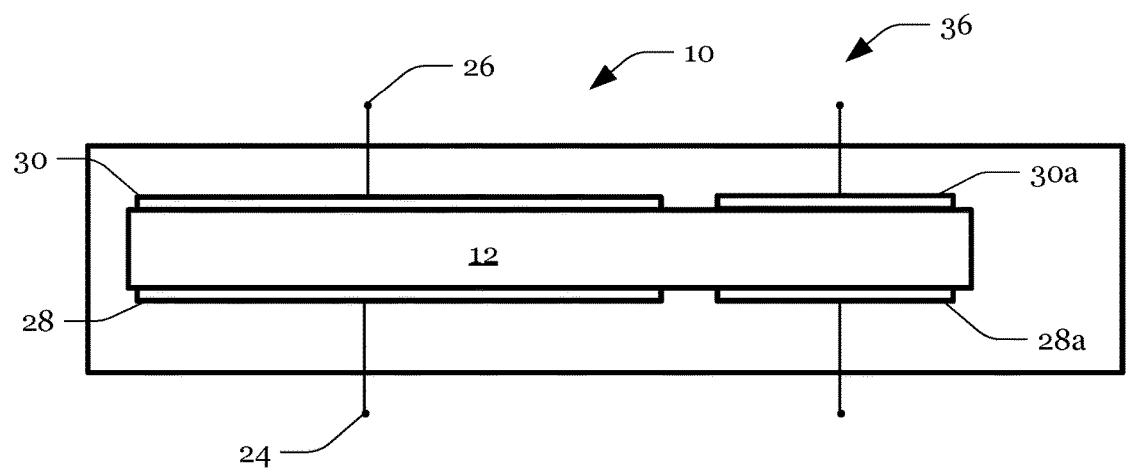
FIG. 3d illustrates a possible implementation of the modification of FIG. 3c.

Furthermore, as illustrated in FIG. 3c, the oscillator 36a may be replaced by a ceramic oscillator 36. The piezoelectric material of the ceramic oscillator 36 may be similar or identical to the piezoelectric material of the piezoelectric element 12 of one or more of the EMI suppression components 10 within the electric circuit, such that a temperature-induced shift of the resonance frequency does not cause frequency misalignment. For example, as shown in FIG. 3d, the ceramic oscillator 36 may even share a piezoelectric element 12 with an EMI suppression component 10.

Figure 4A:
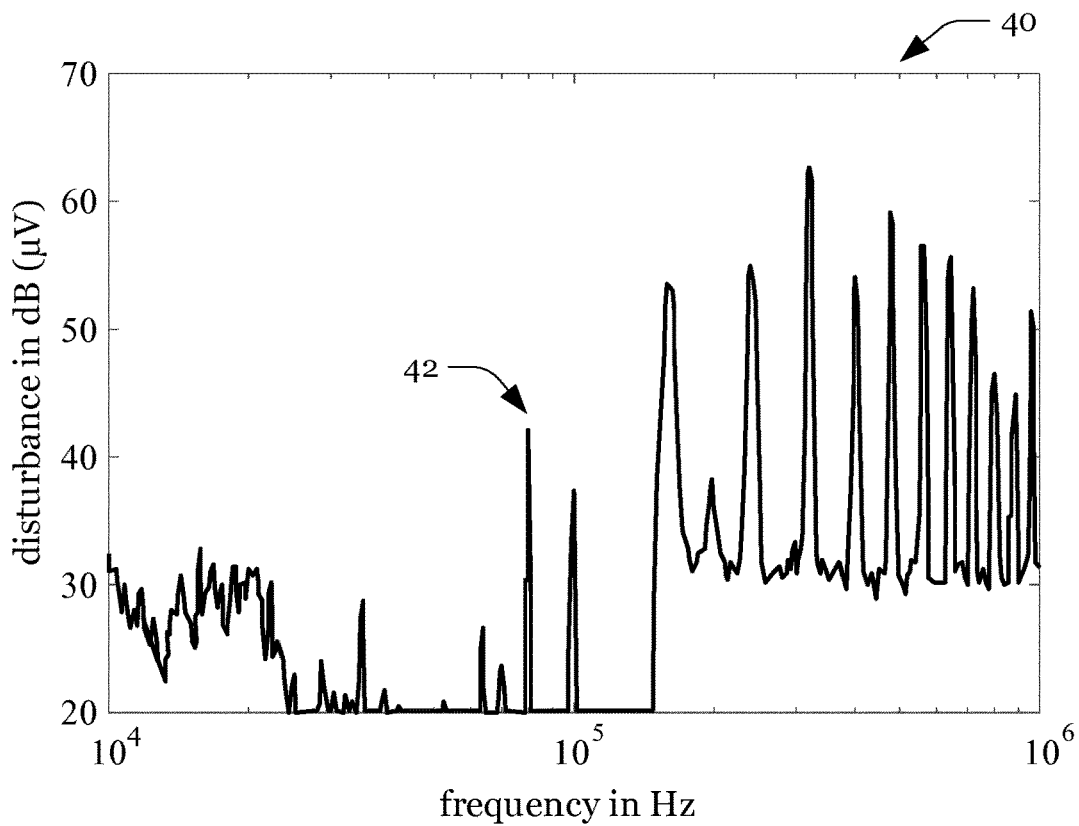
FIG. 4a and FIG. 4b illustrate the attenuation of a peak of an electromagnetic disturbance spectrum.
Figure 4B:
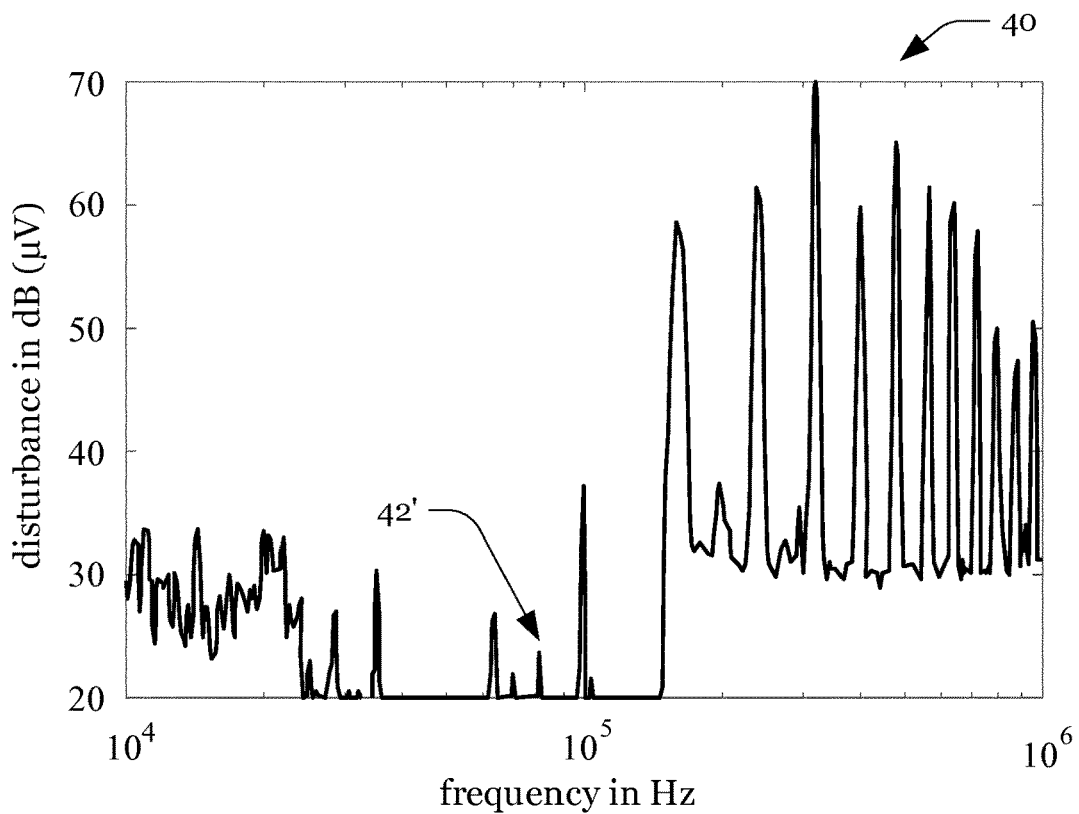

FIG. 4a illustrates an exemplary disturbance spectrum 40. To reduce the disturbance intensity at a peak 42 of the spectrum 40, the piezoelectric element 12 and/or the electrodes 28 and 30 of the EMI suppression component 10 may be selected such that a resonance frequency of the piezoelectric element 12 (cf. FIG. 1a) substantially corresponds to the frequency of the peak 42. As shown in FIG. 4b, the EMI suppression component 10 allows for an improved (narrowband) attenuation of the peak 42' compared to the usage of a (regular) capacitor. By further adapting the piezoelectric element 12, the electrodes 28 and 30 or by connecting multiple piezoelectric elements 12/EMI suppression components 10 in parallel, one or more further peaks of the spectrum 40 may be attenuated. Thereby, each piezoelectric element 12 may attenuate one or more disturbance peaks 42.

Figure 5:
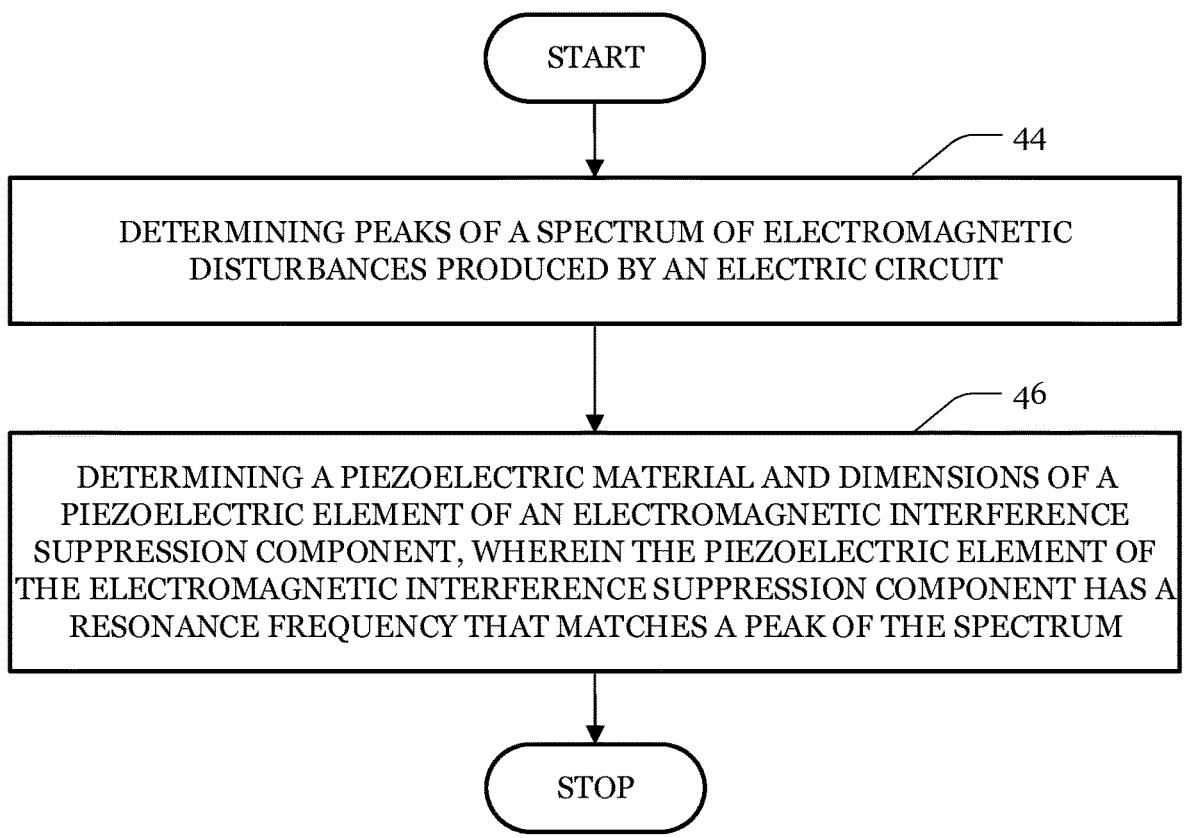
FIG. 5 shows a flow-chart of a method of manufacturing an EMI suppression component.

FIG. 5 shows a flow-chart of a method of manufacturing an EMI suppression component 10. The method may start with a step 44 of determining peaks 42 of the spectrum 40 of the electromagnetic disturbances produced by an electric circuit. The process may then be continued with a step 46 of determining a piezoelectric material and dimensions of the piezoelectric element 12 and the size/shape of the electrodes 28 and 30 of the EMI suppression component 10, wherein the piezoelectric element 12 of the EMI suppression component 10 has a resonance frequency that matches a peak frequency of the spectrum 40.

Figure 6:
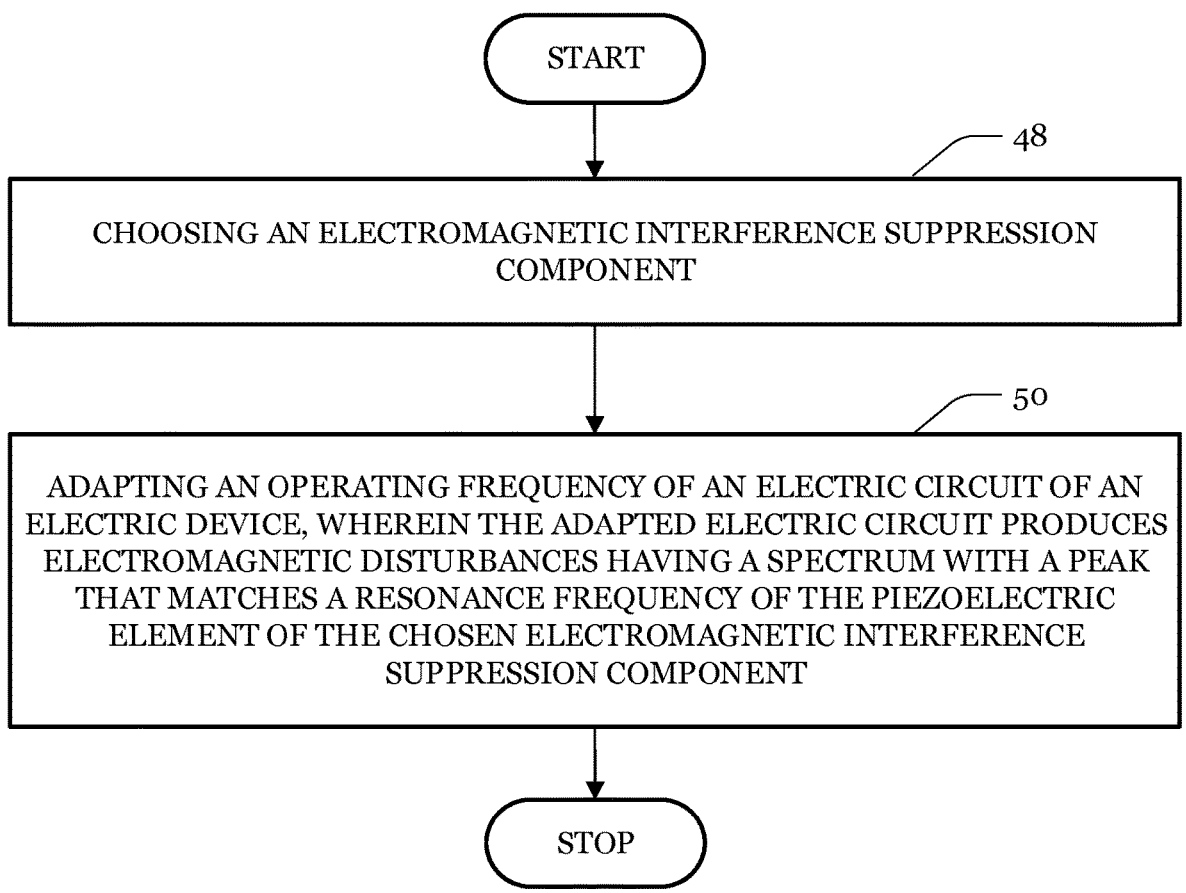
FIG. 6 shows a flow-chart of a method of manufacturing an electric device.

Moreover, instead of tailoring the EMI suppression component 10 to an electric circuit, the electric circuit may also be designed to fit an available EMI suppression component 10, as shown in the flow-chart of FIG. 6. The method shown in the flow-chart of FIG. 6 starts at step 48 with choosing an EMI suppression component 10. After the EMI suppression component 10 has been chosen, the method is continued at step 50 with adapting the operating frequency of an electric circuit, such that the adapted electric circuit produces electromagnetic disturbances having a spectrum with a peak wherein the peak frequency matches a resonance frequency of the piezoelectric element 12 of the chosen EMI suppression component 10.

LIST OF REFERENCE NUMERALS

10 EMI suppression component
12 piezoelectric element
12a disc
12b sheet/beam
22 port
24 first terminal
26 second terminal
28 conductive material (layer)
28a conductive material (layer)
30 conductive material (layer)
30a conductive material (layer)
32 switching power supply
32a switching power supply
34 mains filter
34a mains filter
36 oscillator
36a oscillator
38 control circuit
40 spectrum (disturbance)
42 peak
44 process step
46 process step
48 process step
50 process step

The invention claimed is:

1. An electric circuit comprising an electromagnetic interference suppression component comprising a piezoelectric element that is configured to provide a low impedance propagation path for electromagnetic disturbances at a resonance frequency of the piezoelectric element, the electric circuit being configured to be operated at a fixed switching or clock frequency causing electromagnetic disturbances with a spectrum having a peak, wherein the resonance frequency of the piezoelectric element matches the peak frequency.

2. A power distribution system filter comprising the electric circuit according to claim 1.

3. The electric circuit of claim 1, wherein the spectrum of the electromagnetic disturbances has another peak at another resonance frequency of the piezoelectric element.

4. The electric circuit of claim 1, wherein the electromagnetic interference suppression component serves as a Y-capacitor or an X-capacitor.

5. The electric circuit of claim 1, further comprising a power distribution system filter, the power distribution system filter comprising the electromagnetic interference suppression component.

6. The electric circuit of claim 1, wherein the electromagnetic interference suppression component is arranged between galvanically isolated primary and secondary sides of a converter, in particular a power supply.

7. The electric circuit of claim 6, wherein the converter is one of:
a flyback converter;
an active clamp flyback converter;
a forward-converter;
an active clamp forward-converter;
an asymmetric half-bridge;
a phase-shifted full-bridge; or
a dual-active bridge.

8. The electric circuit of claim 6, further comprising another electromagnetic interference suppression component comprising a second piezoelectric element that is configured to provide a low impedance propagation path for electromagnetic disturbances at a resonance frequency of the second piezoelectric element, wherein the another electromagnetic interference suppression component serves as a line filter.

9. The electric circuit of claim 1, further comprising a capacitor and/or another electromagnetic interference suppression component which is/are connected in parallel to said electromagnetic interference suppression component, wherein the another electromagnetic interference suppression component comprises a second piezoelectric element that is configured to provide a low impedance propagation path for electromagnetic disturbances at a resonance frequency of the second piezoelectric element.

10. The electric circuit of claim 1, further comprising a ceramic oscillator, wherein the ceramic oscillator comprises a piezoelectric resonator:
of a same piezoelectric material as the piezoelectric element; and/or
having a same temperature-dependency regarding one or more resonance frequencies as the piezoelectric element, within an operating range of the ceramic oscillator.

11. A device comprising the electric circuit according to claim 10, and an integrated circuit configured to control the fixed switching or clock frequency of the electric circuit to the effect that the fixed switching or clock frequency or a harmonic of the fixed switching or clock frequency matches the resonance frequency of the piezoelectric element, wherein the integrated circuit is connected to the piezoelectric resonator.

12. The electric circuit of claim 1, further comprising a ceramic oscillator, wherein the piezoelectric element serves as a piezoelectric resonator of the ceramic oscillator.

13. The electric circuit of claim 1, wherein the piezoelectric element is clamped between walls of a housing of the electromagnetic interference suppression component or between one of the walls of the housing of the electromagnetic interference suppression component and another piezoelectric element.

14. A device comprising the electric circuit according to claim 1, wherein the electric circuit is one of:
   a switching power supply;
   a digital circuit;
   a motor;
   a motor drive; or
   an electronic circuit.

15. The device of claim 14, wherein the resonance frequency of the piezoelectric element is tuned to the fixed switching or clock frequency or a harmonic of the fixed switching or clock frequency, wherein the fixed switching or clock frequency or the harmonic of the fixed switching or clock frequency falls under an applicable electromagnetic interference (EMI) regulation.

16. The device of claim 14, wherein the fixed switching or clock frequency is:
   at or above 150 kHz, wherein the resonance frequency of the piezoelectric element is tuned to the fixed switching or clock frequency; or
   below 150 kHz, wherein the resonance frequency of the piezoelectric element is tuned to a harmonic of the fixed switching or clock frequency, wherein the harmonic has a frequency above 150 kHz.

17. A method of manufacturing an electromagnetic interference suppression component, the method comprising:
   determining peaks of a spectrum of electromagnetic disturbances produced by an electric circuit; and
   determining a piezoelectric material and dimensions of a piezoelectric element of the electromagnetic interference suppression component that is configured to provide a low impedance propagation path for electromagnetic disturbances at a resonance frequency of the piezoelectric element, wherein the piezoelectric element of the electromagnetic interference suppression component has a resonance frequency that matches a peak of the spectrum.

18. A method of manufacturing an electric device, the method comprising:
   choosing an electromagnetic interference suppression component comprising a piezoelectric element that is configured to provide a low impedance propagation path for electromagnetic disturbances at a resonance frequency of the piezoelectric element; and
   adapting a layout of an electric circuit of the electric device, wherein the adapted electric circuit produces electromagnetic disturbances having a spectrum with a peak that matches a resonance frequency of the piezoelectric element of the chosen electromagnetic interference suppression component.

19. The method of manufacturing an electric device of claim 18, wherein adapting the layout of the electric circuit of the electric device is performed such that the adapted electric circuit produces the electromagnetic disturbances having the spectrum with another peak that matches another resonance frequency of the piezoelectric element.

20. The method of manufacturing an electric device of claim 18, further coupling a capacitor and/or another electromagnetic interference suppression component in parallel to said electromagnetic interference suppression component, wherein the another electromagnetic interference suppression component comprises a second piezoelectric element that is configured to provide a low impedance propagation path for electromagnetic disturbances at a resonance frequency of the second piezoelectric element.

* * * * *